United States Patent
Heo et al.

(10) Patent No.: US 10,910,551 B2
(45) Date of Patent: Feb. 2, 2021

(54) PIEZOELECTRIC MATERIAL, PIEZOELECTRIC DEVICE INCLUDING THE PIEZOELECTRIC MATERIAL, AND METHOD OF MANUFACTURING THE PIEZOELECTRIC MATERIAL

(71) Applicants: Samsung Electronics Co., Ltd., Suwon-si (KR); Virginia Tech Intellectual Properties, Inc., Blacksburg, VA (US)

(72) Inventors: Jin S. Heo, Hwaseong-si (KR); Kyunghoon Cho, Suwon-si (KR); Shashank Priya, Blacksburg, VA (US); Yongke Yan, Blacksburg, VA (US)

(73) Assignees: SAMSUNG ELECTRONICS CO., LTD., Gyeonggi-Do (KR); VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 509 days.

(21) Appl. No.: 15/804,105

(22) Filed: Nov. 6, 2017

(65) Prior Publication Data

US 2019/0140161 A1    May 9, 2019

(51) Int. Cl.
*H01L 41/187*    (2006.01)
*H01L 41/35*    (2013.01)
*H01L 41/318*    (2013.01)

(52) U.S. Cl.
CPC ...... *H01L 41/1875* (2013.01); *H01L 41/1876* (2013.01); *H01L 41/318* (2013.01); *H01L 41/35* (2013.01)

(58) Field of Classification Search
CPC . H01L 41/1875; H01L 41/1876; H01L 41/35; H01L 41/318
See application file for complete search history.

(56) References Cited

U.S. PATENT DOCUMENTS

| | | | |
|---|---|---|---|
| 6,355,185 B1 | 3/2002 | Kubota | |
| 7,686,974 B2 | 3/2010 | Priya | |
| 7,807,216 B2 | 10/2010 | Zhu et al. | |
| 2005/0127795 A1* | 6/2005 | Torii | H01L 41/094 310/360 |
| 2006/0012648 A1* | 1/2006 | Ifuku | H01L 41/316 347/72 |
| 2006/0232639 A1* | 10/2006 | Sumi | B41J 2/161 347/68 |
| 2010/0219724 A1* | 9/2010 | Schossmann | C04B 35/638 310/365 |
| 2012/0169183 A1* | 7/2012 | Kim | H01L 41/1876 310/363 |
| 2016/0240768 A1* | 8/2016 | Fujii | H01L 41/0973 |

FOREIGN PATENT DOCUMENTS

| | | |
|---|---|---|
| JP | 2001-002469 A | 1/2001 |
| KR | 100237294 B1 | 10/1999 |
| KR | 1020120077160 A | 7/2012 |

* cited by examiner

*Primary Examiner* — Bryan P Gordon
(74) *Attorney, Agent, or Firm* — Cantor Colburn LLP (57) ABSTRACT

A piezoelectric material includes a first material layer including a polycrystalline lead zinc niobate-lead zirconate titanate material arranged in a 001 crystal direction; and a second material layer including a mono-crystalline material having a 001 crystal face, wherein the lead zinc niobate-lead zirconate titanate and the mono-crystalline material are different. Also a piezoelectric device including the piezoelectric material.

17 Claims, 8 Drawing Sheets

PIEZOELECTRIC MATERIAL, PIEZOELECTRIC DEVICE INCLUDING THE PIEZOELECTRIC MATERIAL, AND METHOD OF MANUFACTURING THE PIEZOELECTRIC MATERIAL

BACKGROUND

1. Field

The present disclosure relates to a piezoelectric material, a piezoelectric device including the piezoelectric material, and methods of manufacturing the piezoelectric material.

2. Description of the Related Art

Studies on energy harvesting have been actively conducted in response to fossil fuel depletion. Energy harvesting denotes the process of using wasted energy from the ambient surroundings by converting this energy into electrical energy. There are many sources for harvesting energy, for example, light, heat, electromagnetic waves, or vibrations. Piezoelectric materials have been used for collecting vibrational energy and transforming this energy into electrical energy, and storing this useful energy.

A piezoelectric material converts electrical energy into mechanical energy, or vice versa, and is used in pressure sensors, image sensors, actuators, and ultra small motors. Various materials have been studied and used as piezoelectric materials. When a piezoelectric material converts mechanical energy into electrical energy by absorbing the mechanical energy, the electrical energy per unit volume may be expressed via Equation 1.

$$u = \frac{1}{2}(d \times g)T^2 \quad \text{Equation 1}$$

In Equation 1, u represents electrical energy per unit volume, T represents mechanical stress, and d and g respectively denote a piezoelectric charge constant and a piezoelectric voltage constant. As shown in Equation 1, when an external stress is applied to a piezoelectric material, the degree of energy conversion from the external stress into electrical energy by the piezoelectric material varies with the values of d and g.

There remains a need for an improved piezoelectric material.

SUMMARY

Provided is a polycrystalline piezoelectric material having a 100 crystal direction.

Provided is a piezoelectric device including the polycrystalline piezoelectric material.

Provided are methods of manufacturing the polycrystalline piezoelectric materials.

Additional aspects will be set forth in part in the description which follows and, in part, will be apparent from the description, or may be learned by practice of the presented embodiments.

According to an aspect of an embodiment, a piezoelectric material includes: a first material layer including polycrystalline lead zinc niobate-lead zirconate titanate arranged in a 001 crystal direction; and a second material layer including a mono-crystalline material having a 001 crystal face, wherein the lead zinc niobate-lead zirconate titanate and the mono-crystalline material are different.

The first material layer may include a material having a chemical formula of $(1-x)PbZn_{1/3}Nb_{2/3}O_3-(x)PbZr_{(1-y)}Ti_yO_3$.

The second material layer may include a $BaTiO_3$ mono-crystalline material.

The first material layer may be doped with at least one of Mn and Ni.

The second material layer may have a flat plate shape having a relatively wide {001} crystal face than other crystal faces.

According to an aspect of an embodiment, a piezoelectric device includes: a first material layer including polycrystalline lead zinc niobate-lead zirconate titanate arranged in a 001 crystal direction; a second material layer including a mono-crystalline material having a 001 crystal face, wherein the lead zinc niobate-lead zirconate titanate and the mono-crystalline material are different; and first and second electrode layers disposed on opposite surfaces of the first material layer, respectively.

The electrode layers may be formed on the both surfaces of the first material layer and disposed substantially parallel to a relatively wide face of the second material layer.

The electrode layers may be formed on the both surfaces of the first material layer and disposed substantially perpendicular to a relatively wide face of the second material layer.

The electrode layers may form an acute angle of about 45° or less with respect to the {001} crystal face of the second material layer.

The electrode layers may form an angle of about 45° or more with respect to the {001} crystal face of the second material layer.

According to an aspect of an embodiment, a method of manufacturing a piezoelectric material includes: mixing a lead zinc niobate-lead zirconate titanate, a binder, and a solvent to form a first mixture; adding a mono-crystalline material to the first mixture to form a second mixture; disposing the second mixture to form a material layer having a film shape; removing the solvent and the binder from the material layer; and sintering the material layer to manufacture the piezoelectric material, wherein the piezoelectric material layer includes a first material layer including polycrystalline lead zinc niobate-lead zirconate titanate material arranged in a 001 crystal direction, and a second material layer including a mono-crystalline material having a 001 crystal face.

The mono-crystalline material may be a $BaTiO_3$ mono-crystalline material having a 001 crystal face, and PZN-PZT crystal grains may be arranged in a 001 crystal direction by the sintering process.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

A piezoelectric material, a piezoelectric device, and methods of manufacturing the piezoelectric material will now be described in embodiments, examples of which are illustrated in the accompanying drawings. In the drawings, like reference numerals refer to like elements throughout and a size of each constituent element may be exaggerated for clarity and convenience of explanation. Exemplary embodiments are described herein with reference to cross section illustrations that are schematic illustrations of idealized embodiments. As such, variations from the shapes of the illustrations as a result, for example, of manufacturing techniques and/or tolerances, are to be expected. In this regard, the present embodiments may have different forms and should not be construed as being limited to the descriptions set forth herein. It will also be understood that when an element is referred to as being "on" or "above" another element, the element may be in direct contact with the other element or other intervening elements may be present. In contrast, when an element is referred to as being "directly on" another element, there are no intervening elements present.

"Or" means "and/or." As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
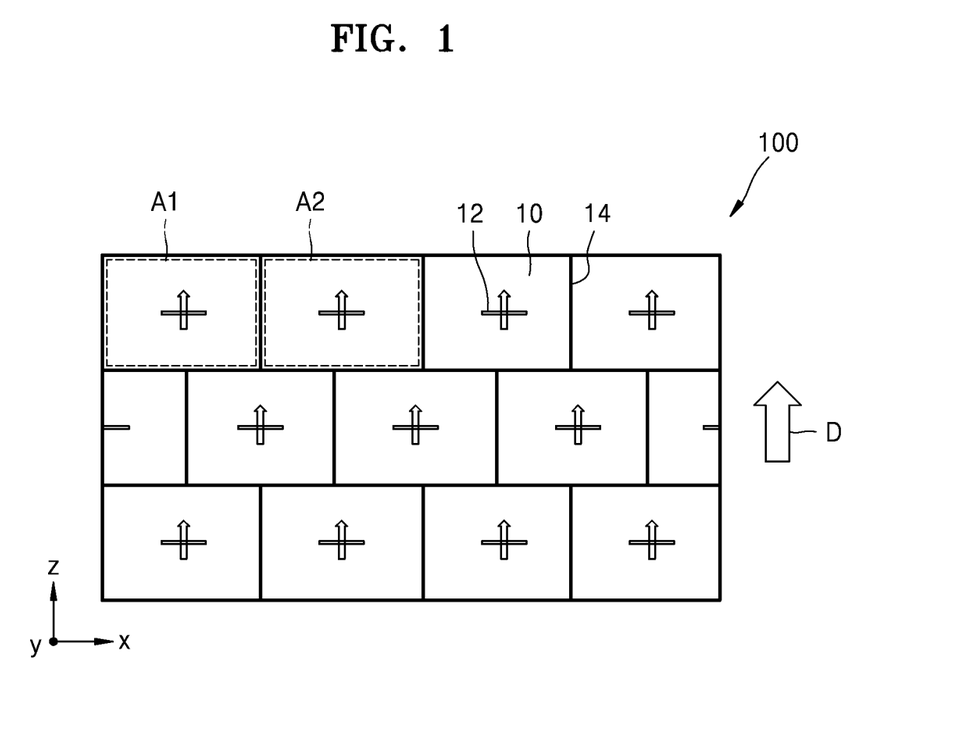
FIG. 1 a schematic cross-sectional view of a piezoelectric material according to an embodiment.

FIG. 1 shows a schematic cross-sectional view of a piezoelectric material 100 according to an embodiment.

Referring to FIG. 1, the piezoelectric material 100 according to an embodiment may be a polycrystalline material including a first material layer 10 including a second material layer 12. The first material layer 10 may form all of the piezoelectric material 100 except for the second material layer 12, and may include crystal grains A1, A2 . . . and a grain boundary 14. Also, the first material layer 10 may include a ceramic solid solution in which a PbZrTi (PZT) oxide is dissolved in a PbZnNb (PZN) oxide ceramic material. A chemical formula of a material of the first material layer 10 may be expressed as $(1-x)PbZn_{1/3}Nb_{2/3}O_3-(x)PbZr_{(1-y)}Ti_yO_3$ wherein $0 \le x \le 1$ and $0 \le y \le 1$. For example, the first material layer 10 may include a material having a composition of $0.5PbZn_{1/3}Nb_{2/3}O_3-0.5PbZr_{0.47}Ti_{0.53}O_3$. The second material layer 12 may include a different material from the material of the first material layer 10. For example, the second material layer 12 may include a mono-crystalline material of $BaTiO_3$. Also, the piezoelectric material 100 according to an embodiment may be doped with at least one of Mn and Ni.

The piezoelectric material 100 according to an embodiment may include a plurality of the crystal grains A1, A2 . . . and a grain boundary 14 between the crystal grains, wherein the polycrystalline material comprises crystal grains. The piezoelectric material may include regions on which the crystal grains A1, A2 . . . are respectively grown in different directions. Each of the crystal grains A1, A2 . .

of the piezoelectric material 100 according to an embodiment may be disposed in a direction substantially parallel to the <001> crystal direction, which is a perpendicular direction to a {001} crystal face. The <001> crystal direction perpendicular to the {001} crystal face of the crystal grains A1, A2 . . . may have substantially the same direction as a z-axis direction.

The PZN-PZT material in the first material layer 10 may be poly-crystalline and may have crystalline anisotropy, for example, a piezoelectric characteristic of the PZN-PZT material changes with the crystal direction of the PZN-PZT material. The PZN-PZT material may have a highest piezoelectric constant when oriented in the <001> crystal direction. Without being bound by theory, a piezoelectric characteristic of a material having a mono-crystalline perovskite structure, such as a PZN-PZT material, appears according to the crystal direction of a PZN-PZT material following spontaneous polarization. In the case of a polycrystalline PZN-PZT material, a crystal directionality does not appear since the crystal directions of the crystal grains are randomly distributed, and, as a result, the polycrystalline PZN-PZT material has a piezoelectric characteristic less than that of the mono-crystalline PZN-PZT material. However, although the piezoelectric material 100 is a polycrystalline material, the piezoelectric material 100 may have a desirable temperature stability and a desirable piezoelectric characteristic since the crystal grains are arranged in a direction substantially parallel to the <001> crystal direction.

Figure 2:
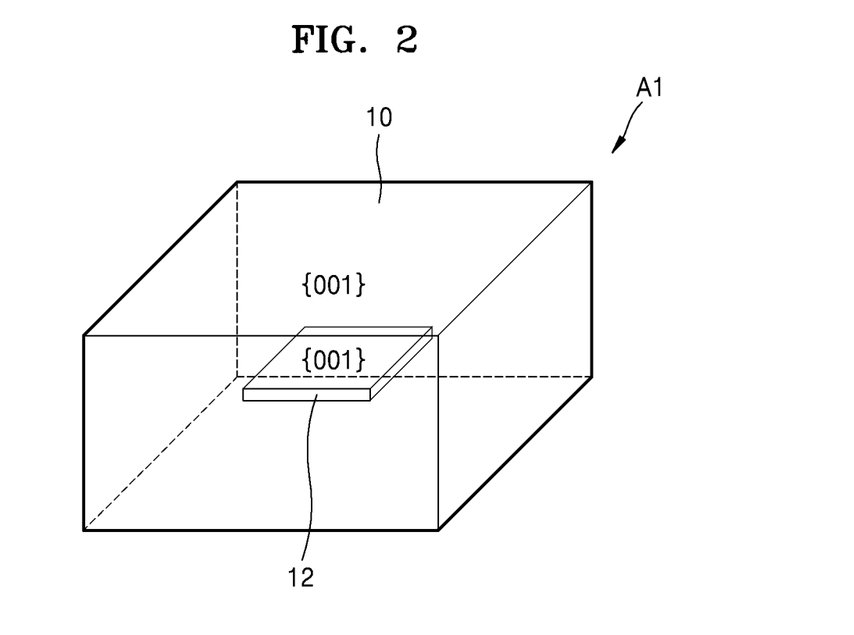
FIG. 2 is a schematic drawing of a structure of a unit crystal grain of a piezoelectric material according to an embodiment.

The first material layer 10 may be formed so that the crystal grains A1, A2 . . . are arranged in the <001> crystal direction according to the crystal direction of the second material layer 12. Each of the crystal grains A1, A2 . . . in the piezoelectric material 100 may include a single second material layer 12. A structure of the crystal grain A1 as a unit crystal grain of the piezoelectric material 100 according to an embodiment will be described with reference to FIG. 2. FIG. 2 is a schematic conceptual drawing of a structure of the crystal grain A1 of the piezoelectric material 100 according to an embodiment.

Referring to FIGS. 1 and 2, the second material layer 12 may include a mono-crystalline material having a plate shape and a {001} crystal face as a major surface. The second material layer 12 may have a plurality of faces, and the {001} crystal face may be a relatively larger face than other crystal faces. Upper and lower faces of the second material layer 12 in the z-direction of FIG. 1 may be wide {001} crystal faces, and the second material layer 12 may have a corresponding plate shape. The wide upper and lower faces of the second material layer 12 are a {001} crystal face, and sides thereof may have faces in a direction perpendicular to the {001} crystal face. As PZN-PZT materials that form the first material layer 10 are grown to be crystalline around the second material layer 12, a PZN-PZT crystal face of the first material layer 10 grown on the {001} crystal face of the second material layer 12 may be formed to have the same {001} crystal face, similar to the {001} crystal face of the second material layer 12. In FIG. 1, arrows indicating an upper direction (the z-direction) are depicted in each of the crystal grains A1, A2 . . . of the piezoelectric material 100 and an arrow D is depicted on a side of the piezoelectric material 100, and the arrows indicate the <100> crystal direction perpendicular to the wide {001} crystal face of the second material layer 12.

As a result, the piezoelectric material 100 according to an embodiment may have a polycrystalline structure. Each of the crystal grains A1, A2 . . . may have substantially the same {001} crystal face and may be arranged in the <001> crystal direction D perpendicular to the {001} crystal face.

Figure 3:
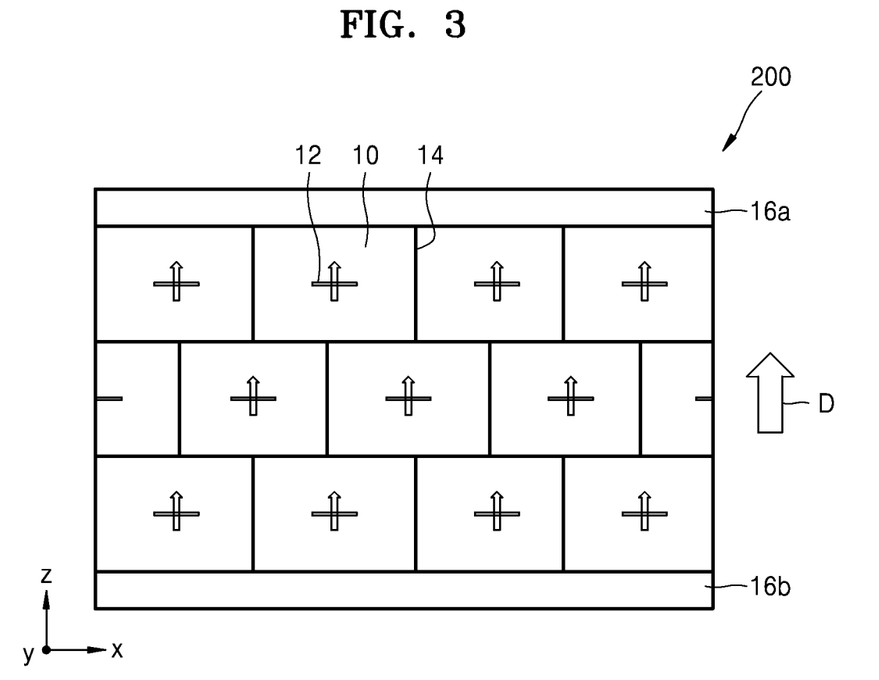
FIG. 3 is a schematic cross-sectional view of a piezoelectric device including a piezoelectric material according to an embodiment.

FIG. 3 is a schematic cross-sectional view of a piezoelectric device including a piezoelectric material according to an embodiment.

Referring to FIGS. 1 and 3, a piezoelectric device 200 may include a 1-1 electrode layer 16a and a 1-2 electrode layer 16b (a first electrode layer 16a and 16b) respectively formed on upper and lower sides of the piezoelectric material 100 of FIG. 1. The 1-1 electrode layer 16a and the 1-2 electrode layer 16b may be in a direction substantially perpendicular to the <001> crystal direction (the x-axis direction) which is perpendicular to the {001} crystal face of the piezoelectric material 100, or may be directly formed on the {001} crystal face of the first material layer 10 of the piezoelectric material 100, the {001} crystal face of the first material layer 10 is in a direction substantially parallel to the wide {001} crystal face of the second material layer 12. The 1-1 electrode layer 16a and the 1-2 electrode layer 16b may be formed to have an acute angle of about 45 degrees or less with respect to the {001} crystal face of the second material layer 12. The 1-1 electrode layer 16a and the 1-2 electrode layer 16b may be formed to face each other and are disposed on opposite sides of the piezoelectric material 100 according to an embodiment.

Figure 4:
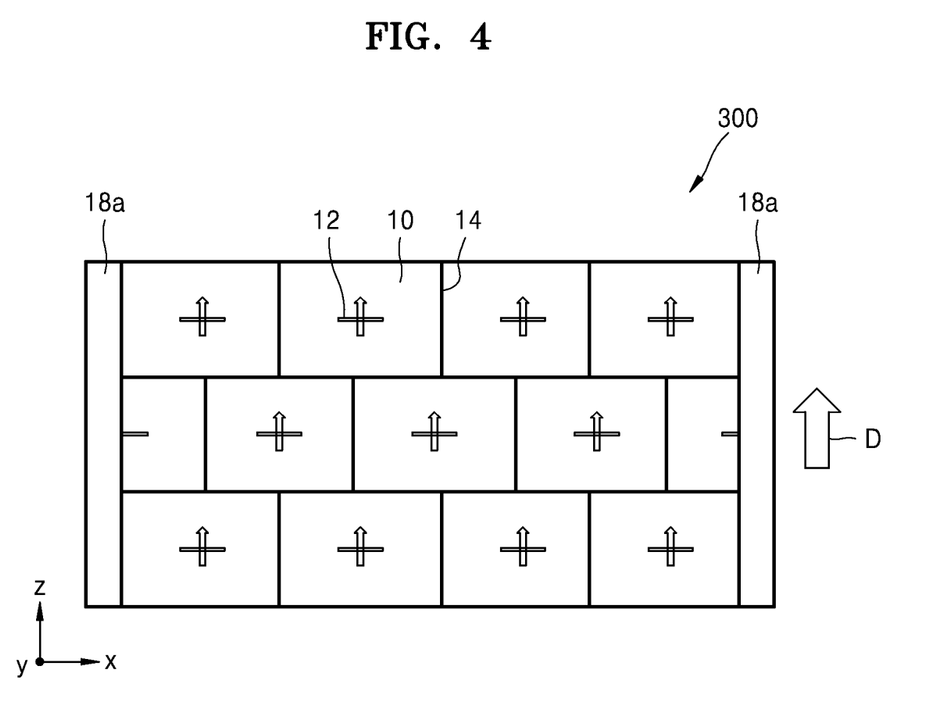
FIG. 4 is a schematic cross-sectional view of a piezoelectric device including a piezoelectric material according to another embodiment.

FIG. 4 is a schematic cross-sectional view of a piezoelectric device 300 including the piezoelectric material 100 according to another embodiment.

Referring to FIGS. 1 and 4, the piezoelectric device 300 may include a 2-1 electrode layer 18a and a 2-2 electrode layer 18b (a second electrode layer 18a and 18b) respectively formed on both sides of the piezoelectric material 100 of FIG. 1. The 2-1 electrode layer 18a and the 2-2 electrode layer 18b may be in a direction substantially parallel to the <001> crystal direction (the z-axis direction) which is in a direction substantially perpendicular to the {001} crystal face of the piezoelectric material 100 according to an embodiment, or may be formed on both surfaces of the first material layer 10 of the piezoelectric material 100 in a direction substantially perpendicular to the wide {001} crystal face of the second material layer 12. The 2-1 electrode layer 18a and the 2-2 electrode layer 18b may be formed to have an angle of about 45 degrees or more with respect to the {001} crystal face of the second material layer 12. The 2-1 electrode layer 18a and the 2-2 electrode layer 18b may substantially face each other with the piezoelectric material 100 according to an embodiment as a center.

The first electrode layer 16a and 16b or the second electrode layer 18a and 18b depicted in FIGS. 3 and 4 may not be parallel or may not be formed in a perpendicular direction to the piezoelectric material 100 of FIG. 1 or the {001} crystal face of the second material layer 12. The first electrode layer 16a and 16b and the second electrode layer 18a and 18b may include a conductive material, and may include at least one of a metal, a conductive oxide, a conductive nitride, and a conductive polymer. The first electrode layers 16a and 16b and the second electrode layer 18a and 18b may be formed of any suitable material that may be used for manufacturing an electrode.

FIGS. 5A through 5E are schematic drawings for illustrating a method of manufacturing the piezoelectric material 100 according to an embodiment. The method of manufacturing the piezoelectric material 100 according to an embodiment will be described with reference to FIGS. 5A through 5E.

Figure 5A:
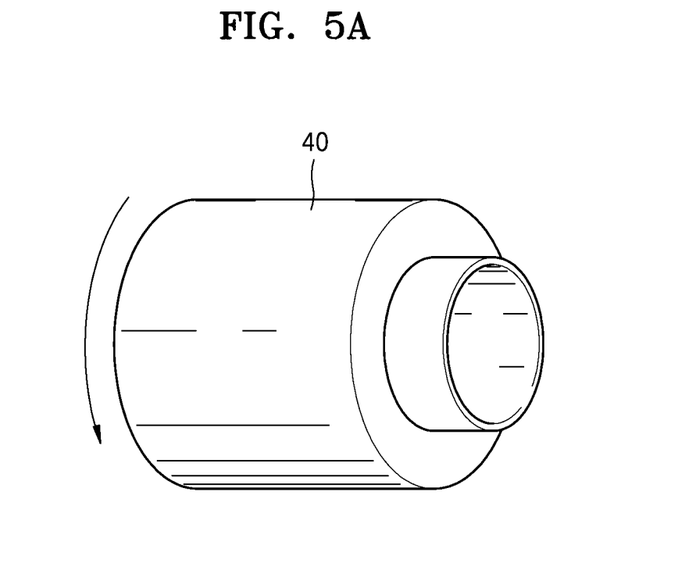
FIGS. 5A through 5E are schematic drawings which show to a method of manufacturing a piezoelectric material according to an embodiment.

Referring to FIG. 5A, powder for forming the first material layer 10 of FIG. 1 is placed in a mixing container 40. For example, a PZN-PZT powder may be placed in the mixing container 40 and additionally a binder and a solvent may also be added in the mixing container 40. The binder may be, for example, a poly-vinyl butyral (PVB) material. The solvent may be, for example, toluene, ethanol, acetone, or a combination thereof. A ball milling process may be performed for mixing a PZN-PZT powder, a binder, and a solvent. In the ball milling process, after placing the PZN-PZT powder, the binder, and the solvent in the mixing container 40, the materials in the mixing container 40 may be compacted by rotating the mixing container 40. The mixed material may be in a slurry state.

Figure 5B:
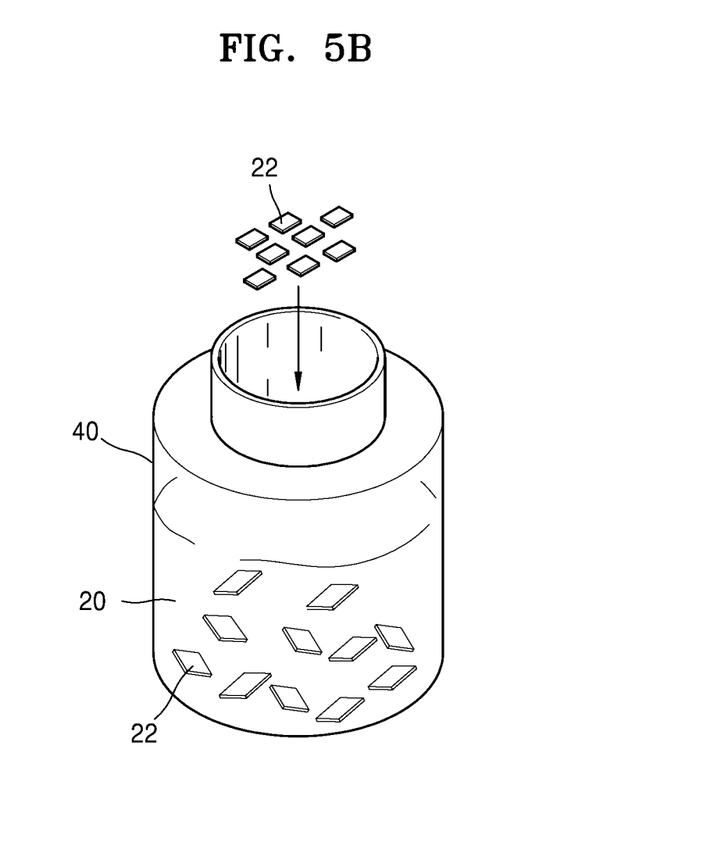

Referring to FIG. 5B, a mono-crystalline material 22 for forming the second material layer 12 of FIG. 1 is added to a mixture 20 of a slurry state described above in the mixing container 40. The mono-crystalline material 22 for forming the second material layer 12 may be, for example, a $BaTiO_3$ mono-crystalline material. The mono-crystalline material 22 may have a flat plate shape having a relatively small thickness or height with respect to a width or a length thereof. The amount of the mono-crystalline material 22 may be optionally controlled according to the amount of the mixture 20.

Figure 5C:
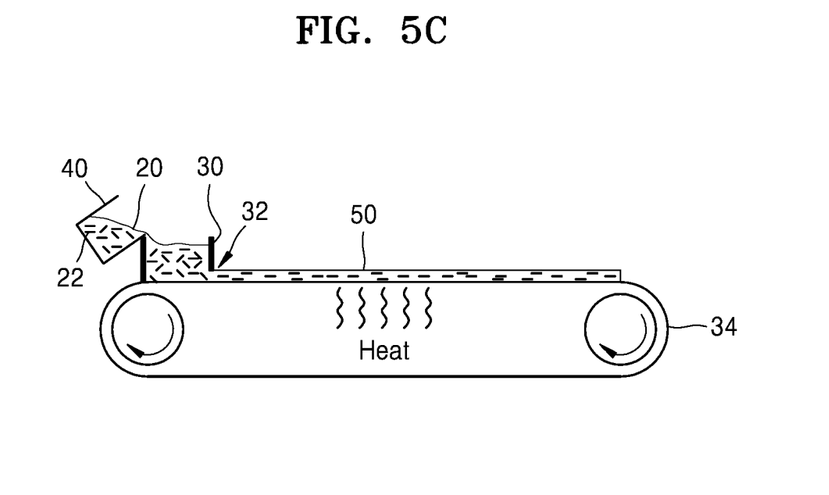

Referring to FIG. 5C, the mixture 20 of a slurry state including the mono-crystalline material 22 may be molded into a thick film tape shape through, for example, a tape casting process. In detail, when the mixture 20 in which the mono-crystalline material 22 is included is added to a dam 30 with an opening 32 having a low height, the mixture 20 in which the mono-crystalline material 22 is included may be discharged on a moving carrier film 34 through the opening 32. The mixture 20 in which the mono-crystalline material 22 is included may be a material layer 50 having a thick film tape shape after being discharged through the opening 32 of the dam 30. The thickness of the material layer 50 may be optionally controlled, and may be selected according to, for example, a height of the opening 32 of the dam 30, a viscosity of the mixture 20, a moving velocity of the carrier film 34, or combination thereof.

Figure 5D:
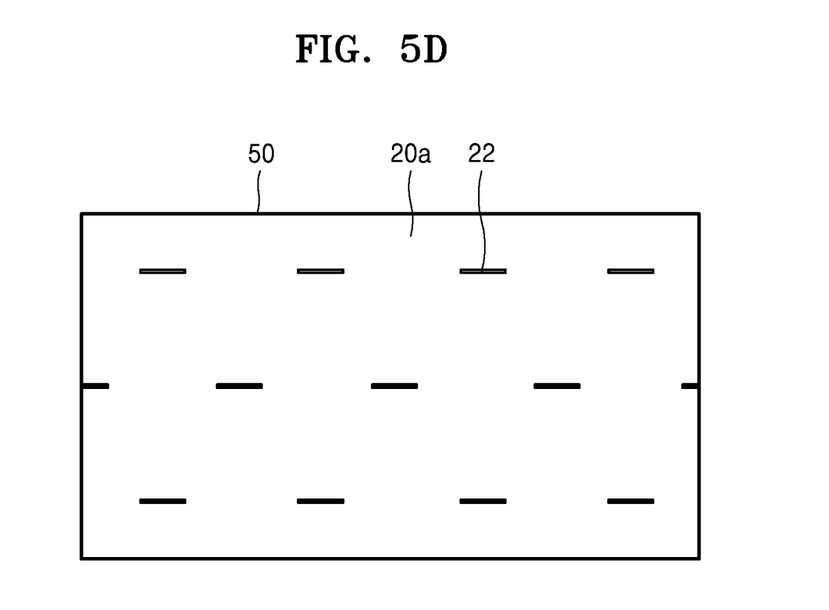

Referring to FIGS. 5C and 5D, the mono-crystalline material 22 may have a flat plate shape having a thickness that is less than a width or a length thereof. In a tape casting process, the mono-crystalline material 22 may be arranged in a casting direction by a shear force acting on the opening 32 of the dam 30 by which the mixture 20 is casted. After the mixture 20 is casted, the mono-crystalline material 22 is arranged in a direction, for example, in an x-axis direction of FIG. 1 and may be included in the material layer 50 by heating. That is, the mono-crystalline material 22 having a flat plate shape may be arranged so that a perpendicular direction with respect to the wide face (e.g., a width or length) thereof is directed in an upper direction or a lower direction thereof, for example, in the z-axis direction of FIG. 1. Also, the material layer 50 may include a mixture 20a formed by evaporating the solvent or other materials of the mixture 20 through a suitable drying process.

The material layer 50 that includes the mixture 20a formed by removing the solvent from the mixture 20 through a drying process, and the mono-crystalline material 22, may be cut to a desired size. Also, the material layer 50 that is cut to fit usages, for example, a suitable thickness to fit a piezoelectric device may be stacked and may be laminated through a heating process and/or a pressing process. Additionally, the binder in the material layer 50 may be removed through a binder burn-out process in an electrical furnace. Accordingly, the material layer 50 may include the mixture 20a from which the solvent and the binder are removed and the arranged mono-crystalline material 22. The mixture 20a may be a PZN-PZT powder. The material layer 50 may be sintered using a suitable sintering process.

Figure 5E:
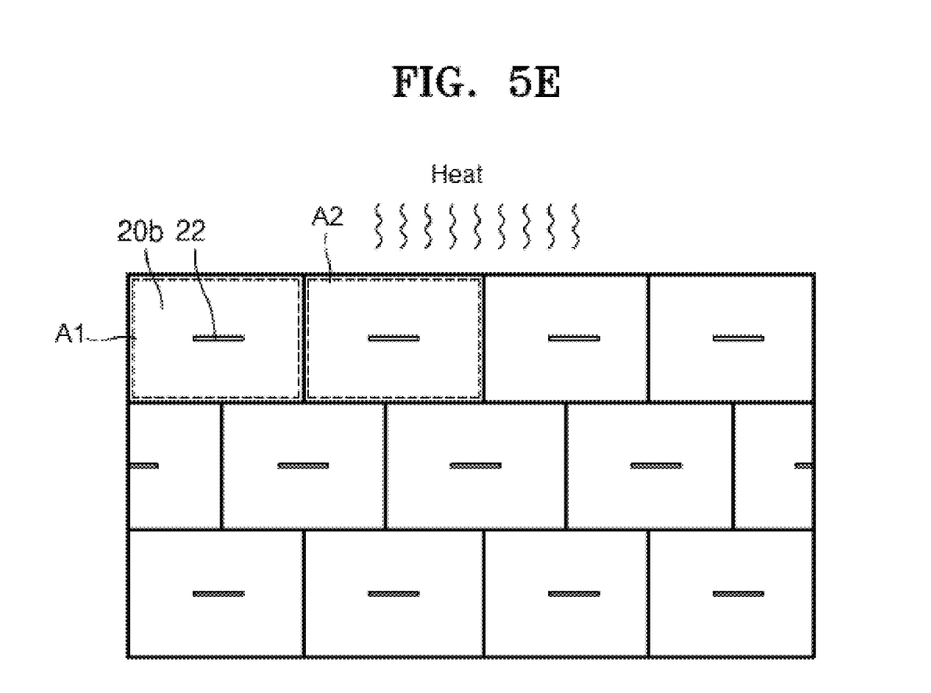

As shown in FIG. 5E, a PZN-PZT crystal 20b that is arranged in a <011> direction around the mono-crystalline material 22 may be formed while growing crystals grains A1, A2 . . . on a surface of the mono-crystalline material 22, for example, a $BaTiO_3$ mono-crystalline material, by diffusing PZN-PZT molecules or constituent atoms of the PZN-PZT molecules around a crystal face of the mono-crystalline material 22 that is arranged in the sintering process.

As a result, the piezoelectric material 100 shown in FIG. 1 may be manufactured through the sintering process. A face that is larger than the other faces, the wide face of the second material layer 12 of FIG. 1, may have a {001} crystal face, and the first material layer 10 formed around the second material layer 12 may be formed so that a crystal direction of the first material layer 10 that is perpendicular to the wide face of the second material layer 12 is a <001> crystal direction. The second material layer 12 may be located in a central region of each of the crystal grains A1, A2 . . . and, without being bound by theory, it may be assumed that the crystal grains A1, A2 . . . are growing with the second material layer 12 as a center. Here, the central regions of the crystal grains A1, A2 . . . may denote regions separated from the grain boundaries 14 of the crystal grains A1, A2 . . . . The <001> crystal direction that is in a direction perpendicular to the {001} crystal faces of the second material layers 12 of the crystal grains A1, A2 . . . may align with the z-axis direction D. Accordingly, the piezoelectric material 100 according to an embodiment is a polycrystalline material having a plurality of the crystal grains A1, A2 . . . , and the crystal grains A1, A2 . . . may be arranged in a direction substantially the same as the <001> crystal direction.

A thickness and the number of crystal grains present in the thickness of a finally obtained piezoelectric material may be controlled by controlling the thickness of the material layer 50, the number of lamination stacks, and the amount of the mono-crystalline material 22. When Mn and Ni are doped in a PZT piezoelectric material having a perovskite crystal structure, the Mn and Ni may reduce a dielectric constant and may increase a piezoelectric voltage constant. At least one of the Mn and the Ni may be additionally doped in a PZN-PZT material prior to the sintering process to provide the 001 crystal direction. In this case, the PZN-PZT material having an increased piezoelectric voltage constant value g may be obtained when compared to that of a PZN-PZT material that is not doped.

A piezoelectric device may be manufactured by additionally combining a metal, a conductive metal oxide, a conductive polymer, or a conductive metal nitride with the piezoelectric material formed according to the method described above. For example, as depicted in FIG. 3, the 1-1 electrode layer 16a and the 1-2 electrode layer 16b may be formed by depositing a metal on symmetrical surfaces of the piezoelectric material. The 1-1 electrode layer 16a and the 1-2 electrode layer 16b may be formed by depositing a metal film by using a physical vapor deposition method, such as sputtering or evaporation. Also, an electrode may be formed by printing a paste containing a metal powder on the upper and lower sides or both sides of a PZN-PZT material.

For reference, in the case of the piezoelectric device 300 shown in FIG. 4, in order to form the 2-1 electrode layer 18a and the 2-2 electrode layer 18b, first, as the piezoelectric device 200 depicted in FIG. 3, a polling process is performed after forming the 1-1 electrode layer 16a and the 1-2 electrode layer 16b parallel to the second material layer 12 on upper and lower surfaces of the piezoelectric material. After removing the 1-1 electrode layer 16a and the 1-2 electrode layer 16b formed on the upper and lower surfaces of the piezoelectric material, the piezoelectric device 300 may be formed by forming the 2-1 electrode layer 18a and the 2-2 electrode layer 18b on both side surfaces of the piezoelectric material.

Figure 6:
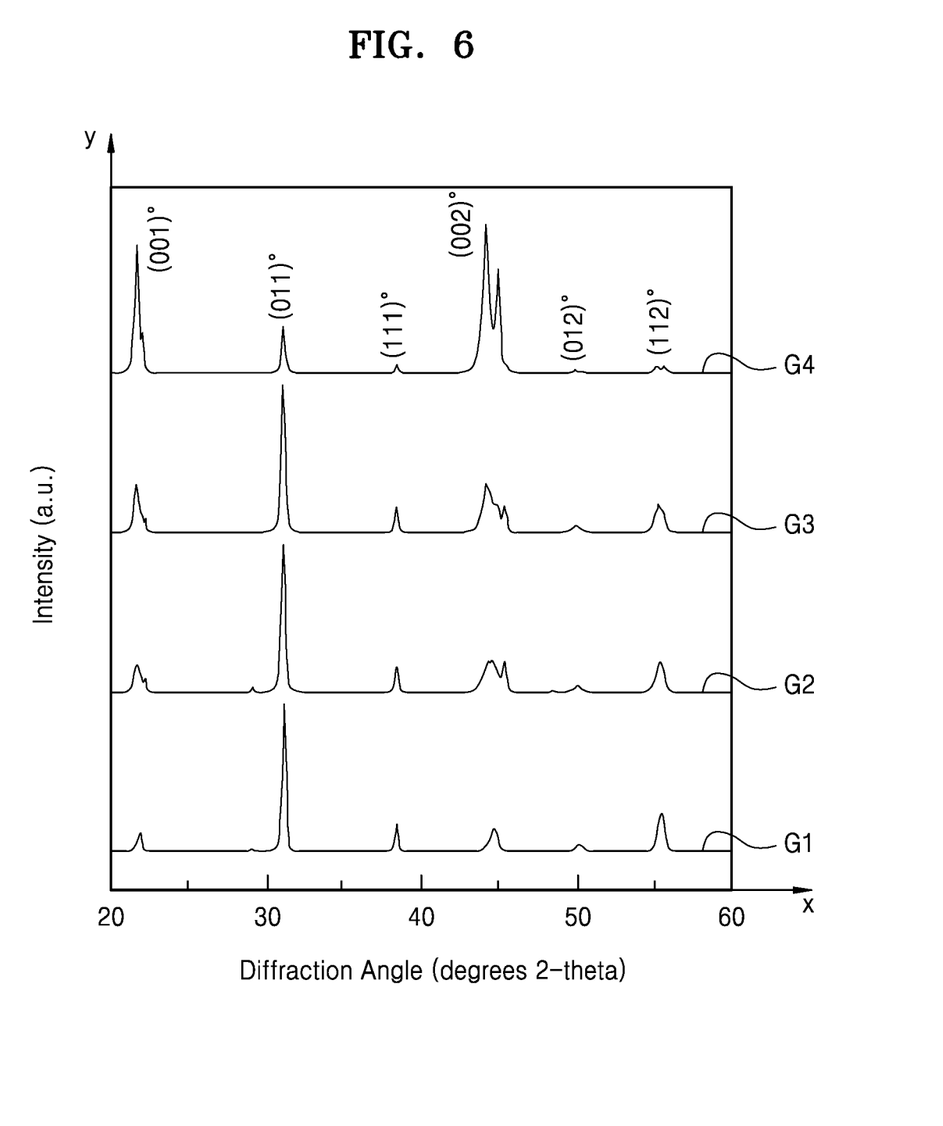
FIG. 6 is a graph of intensity (arbitrary units, a.u.) versus diffraction angle (degrees 2-theta) showing the results of an X-ray diffraction analysis according to heat treatment temperature when manufacturing a piezoelectric material according to an embodiment.

FIG. 6 is a graph showing results of X-ray diffraction according to heat treatment temperature when manufacturing the piezoelectric material 100 according to an embodiment. FIG. 6 shows the results of an X-ray diffraction study of the piezoelectric material according to sintering conditions, that is, a sintering temperature and a sintering time in a process of forming the PZN-PZT crystal 20b around the mono-crystalline material 22 shown in FIG. 5E.

Referring to FIG. 6, G1 represents an X-ray diffraction pattern measured before the sintering process, and G2 represents an X-ray diffraction pattern measured after sintering at a temperature of approximately 900° C. G3 represents an X-ray diffraction pattern measured after a sintering process is performed at a temperature of approximately 1150° C., and G4 represents an X-ray diffraction pattern measured after a sintering process is performed at a temperature of approximately 1150° C. for greater than 5 hours. It may be confirmed from FIG. 6 that as the sintering process is performed at a relatively high temperature, a peak corresponding to a (00n) face (n is an integer) increases in intensity, and peaks corresponding to the other crystal faces decrease in intensity. According to the X-ray diffraction patterns, it may be confirmed that the PZN-PZT crystal is grown in the <001> crystal direction when us the BaTiO$_3$ mono-crystalline material.

A piezoelectric material used for measuring the X-ray diffraction pattern represented by G4 is formed by adding approximately 3 vol % of the BaTiO$_3$ mono-crystalline material to a PZN-PZT material having a composition of 0.5PbZn$_{1/3}$Nb$_{2/3}$O$_3$-0.5PbZr$_{0.47}$Ti$_{0.53}$O$_3$. A piezoelectric charge constant d and a piezoelectric voltage constant g respectively are measured with respect to the manufactured piezoelectric material. The piezoelectric charge constant d$_{33}$ of approximately 530 picocoloumbs per Newton (pC/N) and the piezoelectric voltage constant g$_{33}$ of approximately 34.28×10$^{-3}$ volt meters per Newton (Vm/N) are obtained. As a result, a d$_{33}$*g$_{33}$ value of approximately 18.76×10$^{-12}$ square meters per Newton (m$^2$/N) is obtained.

Figure 7A:
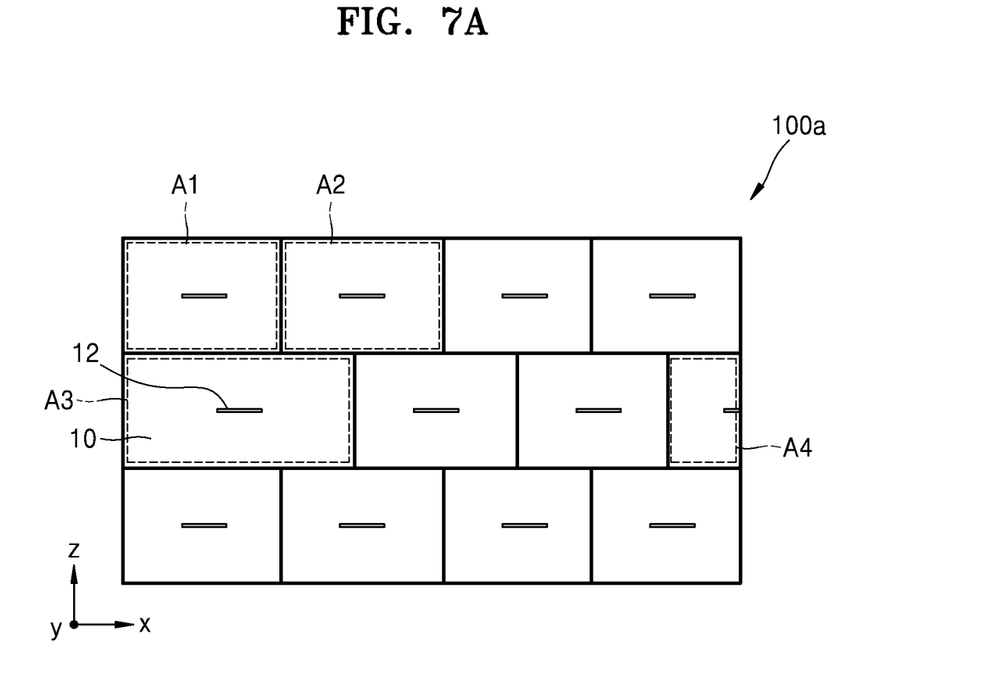
FIGS. 7A and 7B are cross-sectional views of piezoelectric materials according to an embodiment.
Figure 7B:
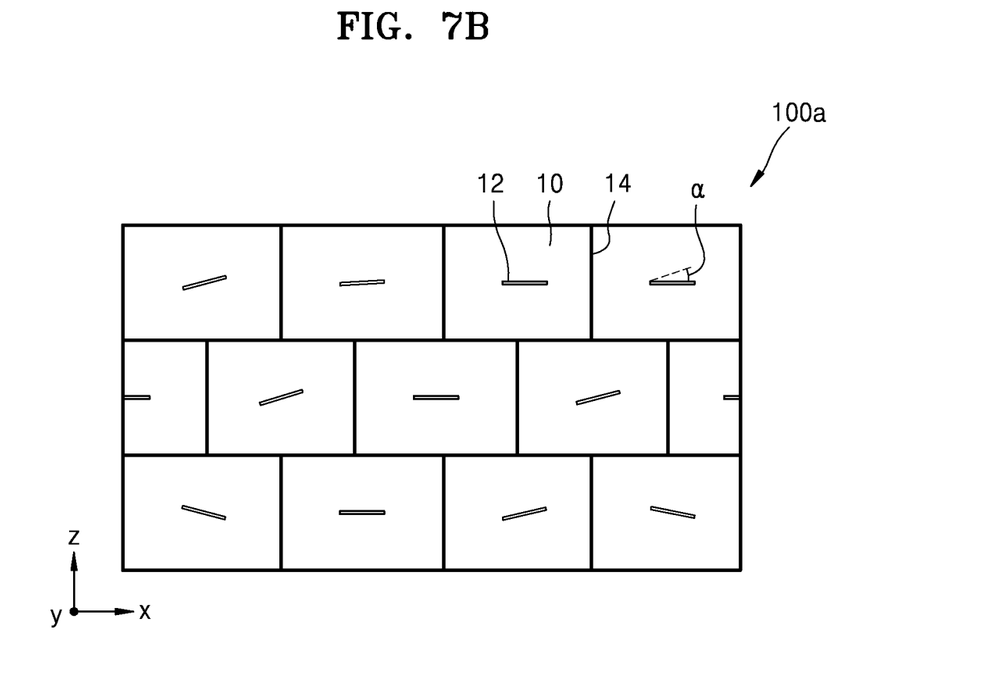

FIGS. 7A and 7B are cross-sectional views of various piezoelectric materials according to an embodiment.

Referring to FIG. 7A, a piezoelectric material 100a may include a plurality of crystal grains A1, A2, A3, A4 . . . and each of the crystal grains A1, A2, A3, A4 . . . may include a first material layer 10 and a second material layer 12. The first material layer 10 and the second material layer 12 may be in the same crystal direction, for example, a <001> crystal direction. Each of the crystal grains A1, A2, A3, A4 . . . may be formed to have substantially the same size or different sizes from each other. The piezoelectric material 100a according to an embodiment may include a polycrystalline material that includes a plurality of crystal grains A1, A2, A3, A4 . . . . In an exemplary embodiment, the size of the crystal grains A1, A2, A3, A4 . . . may not be the same, but the crystal direction thereof is arranged in substantially the same direction, for example, in a <001> crystal direction.

In the piezoelectric material 100a according to an embodiment, the crystal grains A1, A2, A3, A4 . . . are depicted with a rectangular shape for convenience of explanation, and thus, the shape of the crystal grains A1, A2, A3, A4 . . . is not limited thereto. The shape of the crystal grains A1, A2, A3, A4 . . . is not limited to a rectangular shape. For example, the crystal grains A1, A2, A3, A4 . . . may have a polygonal shape, and, in an exemplary embodiment, at least a portion thereof may have a curve shape. The crystal grains A1, A2, A3, A4 . . . may include a polygonal shape, a circular shape, an oval shape, an irregular shape, or a combination thereof.

Referring to FIG. 7B, the piezoelectric material 100a may include a plurality of crystal grains A1, A2, A3, A4 . . . , and each of the crystal grains A1, A2, A3, A4 . . . may include the second material layer 12 formed of a mono-crystalline material. The second material layer 12 may be formed of, for example, a BaTiO$_3$ mono-crystalline material having a flat plate shape and a wide {001} crystal face. According to an exemplary embodiment, the second material layers 12 may not be formed in a parallel arrangement. As depicted in FIG. 7B, some of the second material layers 12 may not be parallel to other second material layers 12, but may be arranged to have an angle α greater than 0°. According to an exemplary embodiment, the second material layers 12 may be parallel to each other. For example, an angle α formed between an xy plane of FIG. 7B and each of the second material layers 12 may be approximately 45°. The grain boundary 14, which is a boundary between the crystal grains in FIG. 7B, is depicted as straight line. The grain boundary 14 is not limited thereto, that is, the grain boundary 14 may have a curve shape.

Figure 8A:
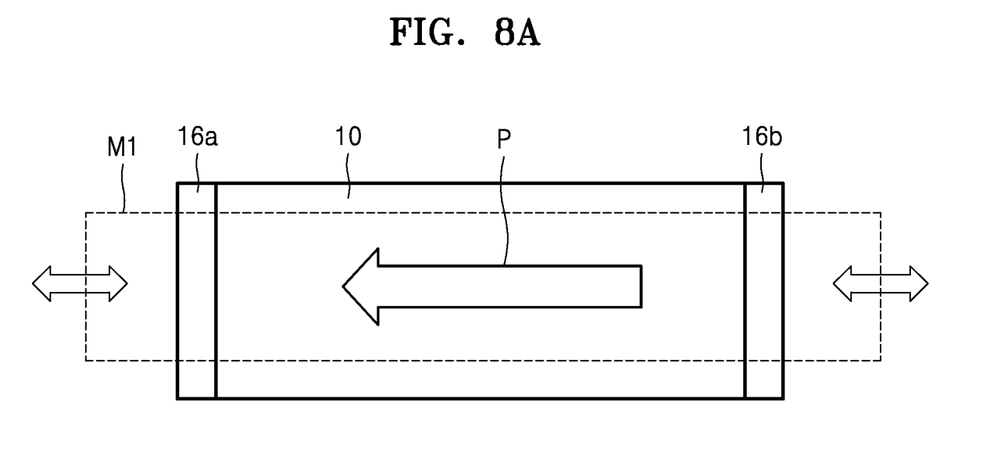
FIGS. 8A through 8C are schematic drawings showing operation modes of a piezoelectric device including a piezoelectric material according to an embodiment.
Figure 8B:
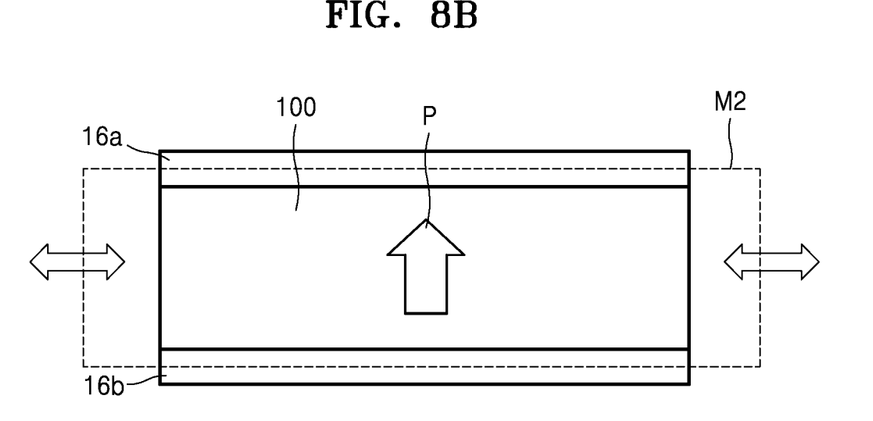
Figure 8C:
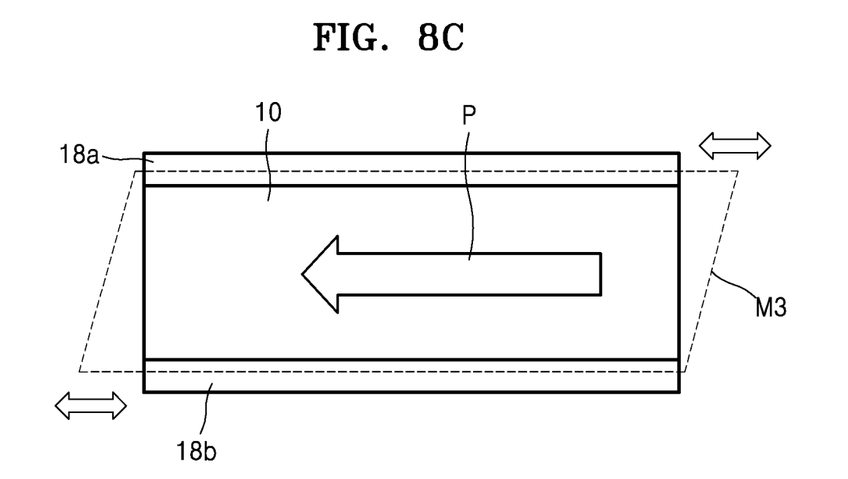

FIGS. 8A through 8C are schematic drawings illustrating the operational modes of a piezoelectric device including a piezoelectric material according to an embodiment.

Referring to FIGS. 8A and 8B, the 1-1 electrode layer 16a and the 1-2 electrode layer 16b are formed on surfaces of the piezoelectric material 100 that are in a direction perpendicular to a polarization direction. In this case, when an alternating-current electric field is applied to the piezoelectric material 100, vibrations in the M1 and the M2 directions are respectively generated. These operation modes are respectively referred to as a 33-mode (FIG. 8A) and a 31-mode (FIG. 8B). In FIG. 8C, the 2-1 electrode layer 18a and the 2-2 electrode layer 18b are formed on surfaces of the piezoelectric material 100 that are in a direction parallel to the polarization direction. In this case, when an alternating-current electric field is applied to the piezoelectric material 100, a vibration of an M3 type is generated. This operation mode is referred to as a 15-mode (FIG. 8C).

According to an exemplary embodiment, a piezoelectric material and a piezoelectric device having suitable temperature stability may be provided by forming a PZN-PZT material having a polycrystalline structure. Also, a piezoelectric material and a piezoelectric device having a desirable piezoelectric characteristic may be provided by forming the PZN-PZT material in a <001> crystal direction by including BaTiO$_3$ in the polycrystalline structure. According to an exemplary embodiment, a method of manufacturing a piezoelectric material may be provided. The method may use a ceramic process, and thus, may be economical. Also, a piezoelectric material having a desirable surface area may be manufactured by using the method.

While a piezoelectric material having a polycrystalline sintered body, a piezoelectric device, and a method of manufacturing the piezoelectric material have been described with reference to the figures to facilitate understanding the embodiment of the disclosed concept, it will be understood by those of ordinary skill in the art that various changes in form and details may be made therein without departing from the spirit and scope as defined by the following claims.

What is claimed is:

1. A piezoelectric material comprising:
   a first material layer comprising a polycrystalline lead zinc niobate-lead zirconate titanate crystal grain arranged in a 001 crystal direction; and
   a second material layer comprising a mono-crystalline material having a 001 crystal face,
   wherein the lead zinc niobatelead zirconate titanate and the mono-crystalline material are different, and
   wherein the mono-crystalline material is disposed in a central region of the polycrystalline lead zinc niobate-lead zirconate titanate crystal grain.

2. The piezoelectric material of claim 1, wherein the lead zinc niobate-lead zirconate titanate has a chemical formula of $(1-x)PbZn_{1/3}Nb_{2/3}O_3-(x)PbZr_{(1-y)}Ti_yO_3$,
   wherein $0 \leq x \leq 1$ and $0 \leq y \leq 1$.

3. The piezoelectric material of claim 1, wherein the mono-crystalline material is a $BaTiO_3$ mono-crystalline material.

4. The piezoelectric material of claim 1, wherein the first material layer comprises at least one of Mn and Ni.

5. The piezoelectric material of claim 1, wherein the second material layer has a flat-plate shape in which a largest crystal face is a 001 crystal face.

6. A piezoelectric device comprising:
   a piezoelectric material comprising,
      a first material layer comprising a polycrystalline lead zinc niobate-lead zirconate titanate crystal grain arranged in a 001 crystal direction; and
      a second material layer comprising a mono-crystalline material having a 001 crystal face,
      wherein the lead zinc niobate-lead zirconate titanate and the mono-crystalline material are different, and
      wherein the mono-crystalline material is disposed in a central region of the polycrystalline lead zinc niobate-lead zirconate titanate crystal grain; and
   first and second electrode layers disposed on opposite surfaces of the piezoelectric material, respectively.

7. The piezoelectric device of claim 6, wherein the first and second electrode layers disposed on the surfaces of the piezoelectric material are in a direction which is substantially parallel to the 001 crystal face of the mono-crystalline material.

8. The piezoelectric device of claim 6, wherein the first and second electrode layers disposed on the surfaces of the piezoelectric material are in a 6direction substantially perpendicular to the 001 crystal face of the mono-crystalline material.

9. The piezoelectric device of claim 6, wherein the first and second electrode layers form an acute angle of about 45° or less with respect to the 001 crystal face of the mono-crystalline material.

10. The piezoelectric device of claim 6, wherein the first and second electrode layers form an angle of about 45° or more with respect to the 001 crystal face of the mono-crystalline material.

11. The piezoelectric device of claim 6, wherein the lead zinc niobate-lead zirconate titanate has a chemical formula of $(1-x)PbZn_{1/3}Nb_{2/3}O_3-(x)PbZr_{(1-y)}Ti_yO_3$, wherein $0 \leq x \leq 1$ and $0 \leq y \leq 1$.

12. The piezoelectric device of claim 6, wherein the mono-crystalline material is a $BaTiO_3$ mono-crystalline material.

13. The piezoelectric device of claim 6, wherein the first material layer comprises at least one of Mn and Ni.

14. A method of manufacturing a piezoelectric material, the method comprising:
   mixing a lead zinc niobate-lead zirconate titanate, a binder, and a solvent to form a first mixture;
   adding a mono-crystalline material to the first mixture to form a second mixture;
   disposing the second mixture to form a material layer having a film shape;
   removing the solvent and the binder from the material layer; and
   sintering the material layer to manufacture the piezoelectric material,
   wherein the piezoelectric material comprises
      a first material layer comprising a polycrystalline lead zinc niobate-lead zirconate titanate crystal grain arranged in a 001 crystal direction, and
      a second material layer comprising a mono-crystalline material having a 001 crystal face,
      wherein the lead zinc niobate-lead zirconate titanate and the mono-crystalline material are different, and
      wherein the mono-crystalline material is disposed in a central region of the polycrystalline lead zinc niobate-lead zirconate titanate crystal grain.

15. The method of claim 14, wherein the mono-crystalline material is a $BaTiO_3$ mono-crystalline material having a 001 crystal face, and a lead zinc niobate-lead zirconate titanate crystal is arranged in a 001 crystal direction.

16. The piezoelectric material of claim 1, wherein the first material layer is disposed on all surfaces of the second material layer and a crystal direction of the first material layer is perpendicular to a wide face of the second material layer in a 001 crystal direction.

17. The piezoelectric material of claim 1, wherein the first material comprises a plurality of the polycrystalline lead zinc niobate-lead zirconate titanate crystal grains each arranged in a 001 crystal direction, and wherein the mono-crystalline material is disposed in a central region of each of the plurality of polycrystalline lead zinc niobate-lead zirconate titanate crystal grains.

* * * * *